(12) United States Patent
Yang et al.

(10) Patent No.: US 9,980,411 B2
(45) Date of Patent: May 22, 2018

(54) CONNECTOR, CONNECTOR ASSEMBLY AND APPARATUS

(71) Applicant: Tyco Electronics (Shanghai) Co. Ltd., Shanghai (CN)

(72) Inventors: Hongwen Yang, Shanghai (CN); Jian Zhou, Shanghai (CN)

(73) Assignee: Tyco Electronics (Shanghai) Co. Ltd., Shanghai (CN)

(*) Notice: Subject to any disclaimer, the term of this patent is extended or adjusted under 35 U.S.C. 154(b) by 287 days.

(21) Appl. No.: 14/718,626

(22) Filed: May 21, 2015

(65) Prior Publication Data
US 2015/0342090 A1    Nov. 26, 2015

(30) Foreign Application Priority Data

May 21, 2014    (CN) .................... 2014 2 0261447 U

(51) Int. Cl.
| | | |
|---|---|---|
| *H01L 23/40* | (2006.01) | |
| *H01R 13/6583* | (2011.01) | |
| *H05K 7/20* | (2006.01) | |
| *G06F 1/18* | (2006.01) | |
| *G06F 1/20* | (2006.01) | |

(52) U.S. Cl.
CPC ......... *H05K 7/20418* (2013.01); *G06F 1/181* (2013.01); *G06F 1/20* (2013.01); *H01L 23/4093* (2013.01); *H01R 13/6583* (2013.01); *H05K 7/205* (2013.01)

(58) Field of Classification Search
CPC . H01L 2924/00014; H01L 2224/48091; H01L 23/4093; H01L 2924/181; H01L 23/4006; H01L 23/467; H01L 2224/73265; H01L 2224/48247; H01L 2224/32245; H01L 2023/4081; H01L 2023/4062; H05K 7/20418; H05K 7/20409; H05K 7/20436; H05K 9/0007; H05K 2201/10386; H05K 1/0203; H05K 7/20154; H05K 7/2049; H05K 7/205; G06F 1/203; G06F 1/20; G06F 2200/201; G06F 1/1656; G06F 1/181; H01R 13/6583
See application file for complete search history.

(56) References Cited

U.S. PATENT DOCUMENTS

| | | | | |
|---|---|---|---|---|
| 4,190,879 A | * | 2/1980 | Tissot ..................... | H05K 7/12 200/61.45 M |
| 5,880,931 A | * | 3/1999 | Tilton ................ | H05K 7/20345 165/80.4 |
| 6,752,663 B2 | * | 6/2004 | Bright .................. | G02B 6/4201 439/607.25 |

(Continued)

*Primary Examiner* — Adam B Dravininkas
(74) *Attorney, Agent, or Firm* — Barley Snyder

(57) ABSTRACT

A connector assembly is provided and includes a circuit board, an elastic connector, a cage, and a heat exchanger. The circuit board includes a heat exchanger opening passing there through. The elastic connector is positioned about the heat exchanger opening. The cage includes a bottom cage with a cage opening facing a first surface of the circuit board. The heat exchanger is positioned on the bottom cage, such that one side of the heat exchanger passes through the cage opening to protrude inside the cage and an opposite side of the heat exchanger passes through the heat exchanger opening to protrude from a second surface of the circuit board opposite to the first surface.

12 Claims, 7 Drawing Sheets

(56) References Cited

U.S. PATENT DOCUMENTS

| | | | | |
|---|---|---|---|---|
| 6,866,544 B1* | 3/2005 | Casey | ............... | H05K 9/0058 |
| | | | | 439/607.2 |
| 7,150,653 B1* | 12/2006 | Mason | ............ | H01R 13/65802 |
| | | | | 385/92 |
| 2003/0161108 A1* | 8/2003 | Bright | ............... | G02B 6/4201 |
| | | | | 361/707 |
| 2004/0027816 A1* | 2/2004 | Ice | ............... | G02B 6/4201 |
| | | | | 361/797 |
| 2005/0195565 A1* | 9/2005 | Bright | ............... | H04B 1/036 |
| | | | | 361/688 |
| 2006/0082975 A1* | 4/2006 | Caines | ............... | H05K 5/061 |
| | | | | 361/719 |
| 2007/0023879 A1* | 2/2007 | Pandey | ............ | H01L 23/4006 |
| | | | | 257/678 |
| 2007/0223208 A1* | 9/2007 | Tanaka | ............... | H05K 7/12 |
| | | | | 361/807 |
| 2008/0285236 A1* | 11/2008 | Phillips | ............... | G02B 6/4246 |
| | | | | 361/709 |
| 2010/0022113 A1* | 1/2010 | Ito | ............... | H05K 5/0286 |
| | | | | 439/325 |
| 2013/0118781 A1* | 5/2013 | Hwang | ............... | F28F 9/007 |
| | | | | 174/252 |
| 2014/0154912 A1* | 6/2014 | Hirschy | ............... | H01R 13/46 |
| | | | | 439/487 |

* cited by examiner

CONNECTOR, CONNECTOR ASSEMBLY AND APPARATUS

CROSS-REFERENCE TO RELATED APPLICATIONS

This application claims the benefit of the filing date under 35 U.S.C. § 119(a)-(d) of Chinese Patent Application No. 201420261447.X filed May 21, 2014.

FIELD OF THE INVENTION

The present invention relates to a connector, a connector assembly comprising the connector, and an apparatus comprising the connector assembly.

BACKGROUND

A data connector is generally cooled using known heat dissipation techniques. If there is no solid material in a space between a top of a chip of a connector and an external environment, but only air in the space, the space between the chip and an external housing is often very narrow. Considering that the thermal conductivity coefficient of the air is very low, in such an arrangement an effective convection cannot be achieved in so narrow space. The heat generated by the chip cannot thereby be effectively dissipated, and the temperature of the chip may rise. A heat conducting material may be provided between a top of the chip and an external housing. In prior art, the conductive material is generally provided on a top cage of the connector far away from Printed Circuit Board (PCB). This heat dissipation solution is effective for a connector with only a single layer of ports, but is not effective for a connector with a plurality of layers of ports because the bottom layer of ports near PCB cannot be effectively cooled. Thereby, the heat generated by chips in the bottom layer of ports cannot be effectively dissipated, and the temperature of the chip also may rise, and the connector may fail because of overheating.

SUMMARY

The present invention has been made to overcome or alleviate at least one aspect of the above mentioned disadvantages.

An object of the invention, among others, is to provide a connector assembly having a circuit board, an elastic connector, a cage, and a heat exchanger. The circuit board includes a heat exchanger opening passing there through. The elastic connector is positioned about the heat exchanger opening. The cage includes a bottom cage with a cage opening facing a first surface of the circuit board. The heat exchanger is positioned on the bottom cage, such that one side of the heat exchanger passes through the cage opening to protrude inside the cage and an opposite side of the heat exchanger passes through the heat exchanger opening to protrude from a second surface of the circuit board opposite to the first surface.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
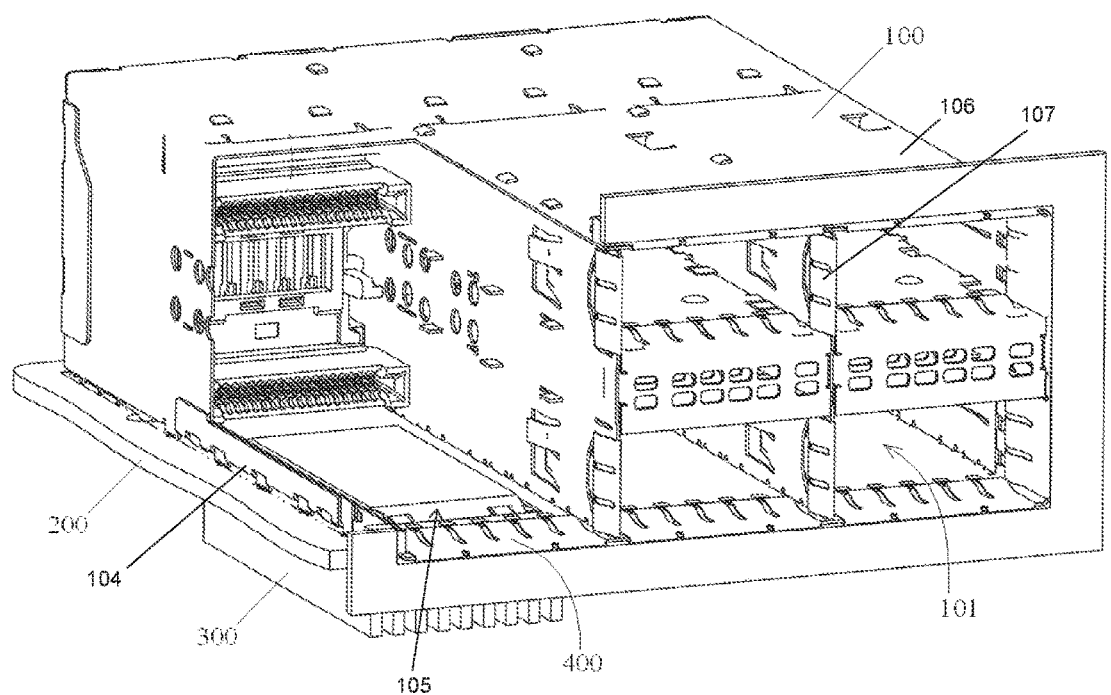
FIG. 1 is a perspective view of a connector assembly according to the invention showing a connector cage having a heat exchanger mounted on the circuit board.
Figure 2:
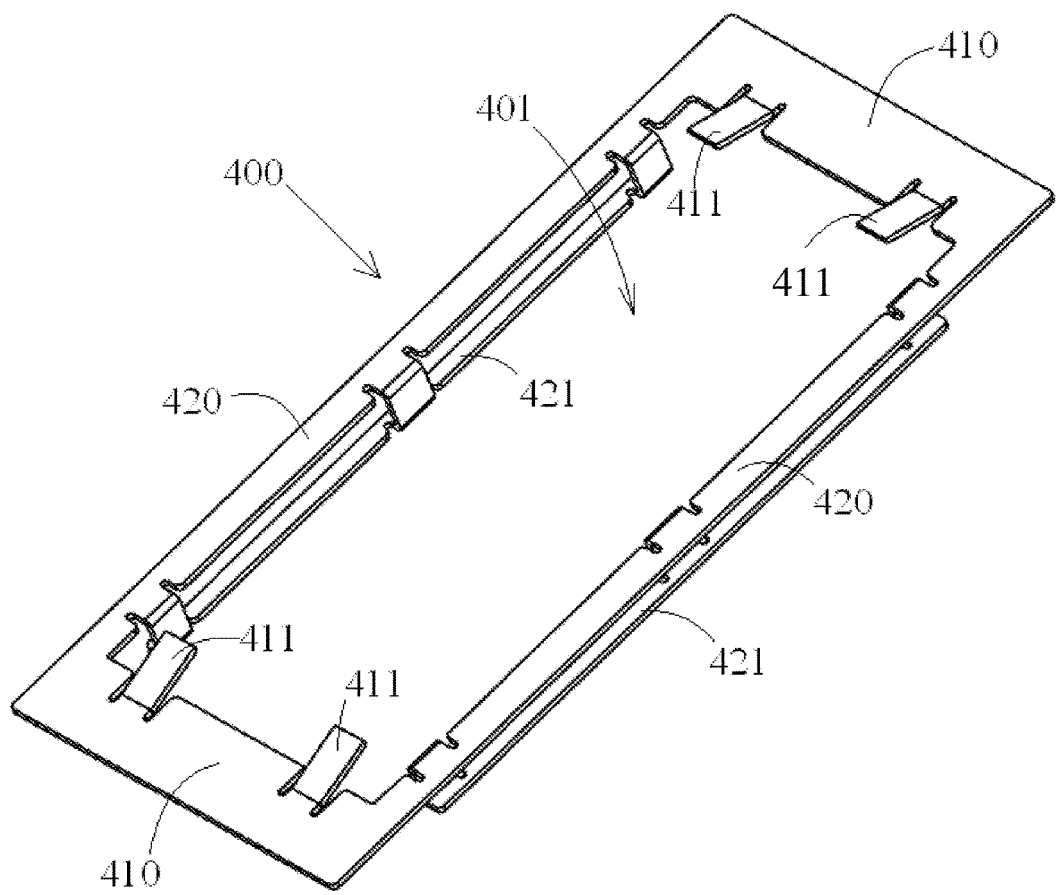
FIG. 2 is a perspective view of an elastic connector for mounting the heat exchanger to the circuit board.

Exemplary embodiments of the invention will be described hereinafter in detail with reference to the attached drawings, wherein the like reference numerals refer to the like elements. The invention may, however, be embodied in many different forms and should not be construed as being limited to the embodiments set forth herein; rather, these embodiments are provided so that the present disclosure will be thorough and complete, and will fully convey the concept of the invention to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the invention, a connector assembly has a connector mounted on a first surface of a circuit board 200. The connector includes a cage 100 having a bottom cage 104 facing the first surface of the circuit board 200, and a heat exchanger 300 located on the bottom cage 104. One side of the heat exchanger 300 passes through an opening 105 formed in the bottom cage 104 to protrude inside the cage 100, and the other side of the heat exchanger 300 passes through an opening 201 formed in the circuit board 200 to protrude from a second surface of the circuit board 200 opposite to the first surface. An elastic connector 400 is mounted on the opening 201 of the circuit board 200, and the heat exchanger 300 is mounted on the circuit board 200 by the elastic connector 400.

As shown in FIG. 1, the connector cage 100 includes an upper layer and a lower layer of ports 101. The connector cage 100 is mounted on a first surface (front surface) of a circuit board 200. In the shown embodiment, a part of the connector cage 100 is cut away to show a heat exchanger 300 provided on a bottom cage 104 of the connector.

As shown in FIG. 1, the connector cage 100 includes a bottom cage 104 facing the circuit board 200, a top cage 106 located above the bottom cage 104, and partition members 107 located between the bottom cage 104 and the top cage 106. The partition members 107 divide an inner space between the bottom cage 104 and the top cage 106 into a plurality of ports 101. In the shown embodiment, the plurality of ports 101 are arranged into two layers, and each layer of ports includes three ports 101.

Figure 3:
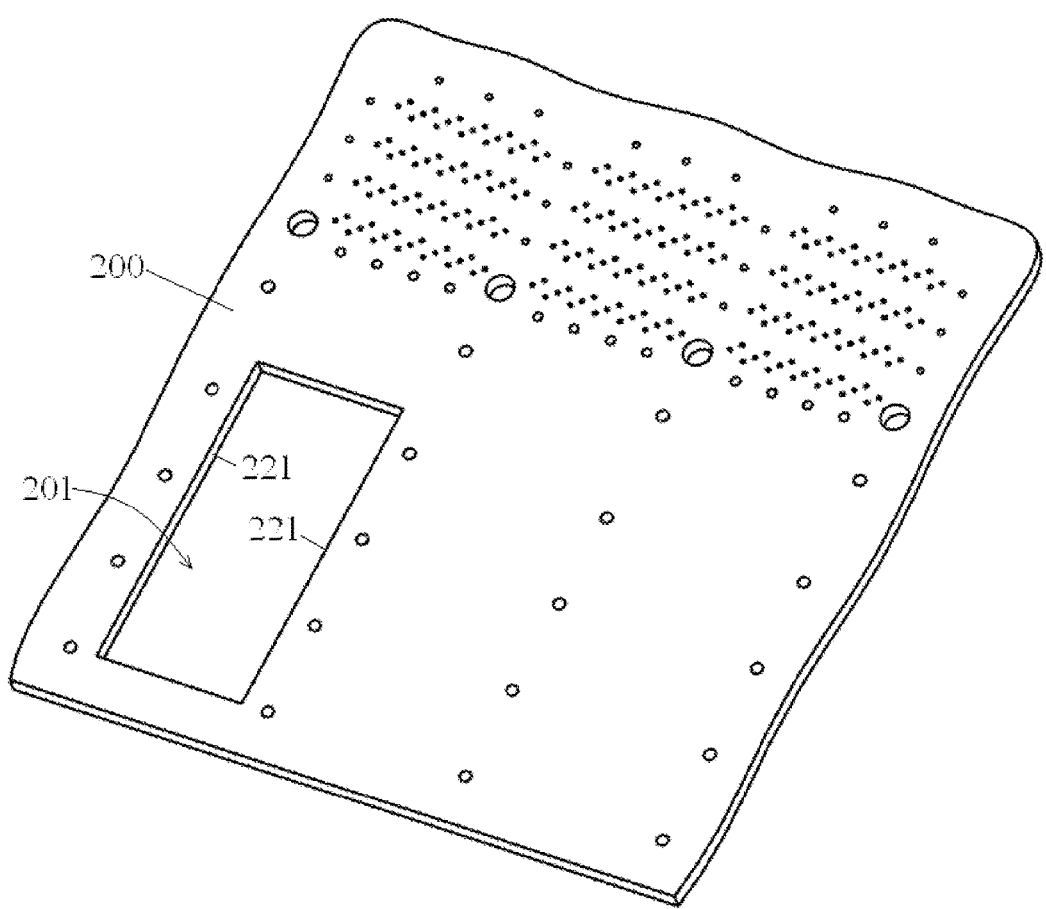
FIG. 3 is a perspective view of a circuit board according to the invention.

As shown in FIG. 1, the connector further includes a finlike heat exchanger 300 on the bottom cage 104 of the connector. One side of the heat exchanger 300 passes through an opening 105 formed in the bottom cage 104 to protrude inside the cage 100, and the other side of the heat exchanger 300 passes through an opening 201 (see FIG. 3) formed in the circuit board 200 to protrude from a second surface (back surface) of the circuit board 200 opposite to the first surface.

One skilled in the art should appreciate that the invention is not limited to the embodiment shown in FIG. 1. For example, the above heat dissipation configuration disclosed in the invention may also adapted to a connector with only a single layer of ports, that is, the heat exchanger 300 may be provided on a bottom cage 104 of a connector with only a single layer of ports.

Figure 6:
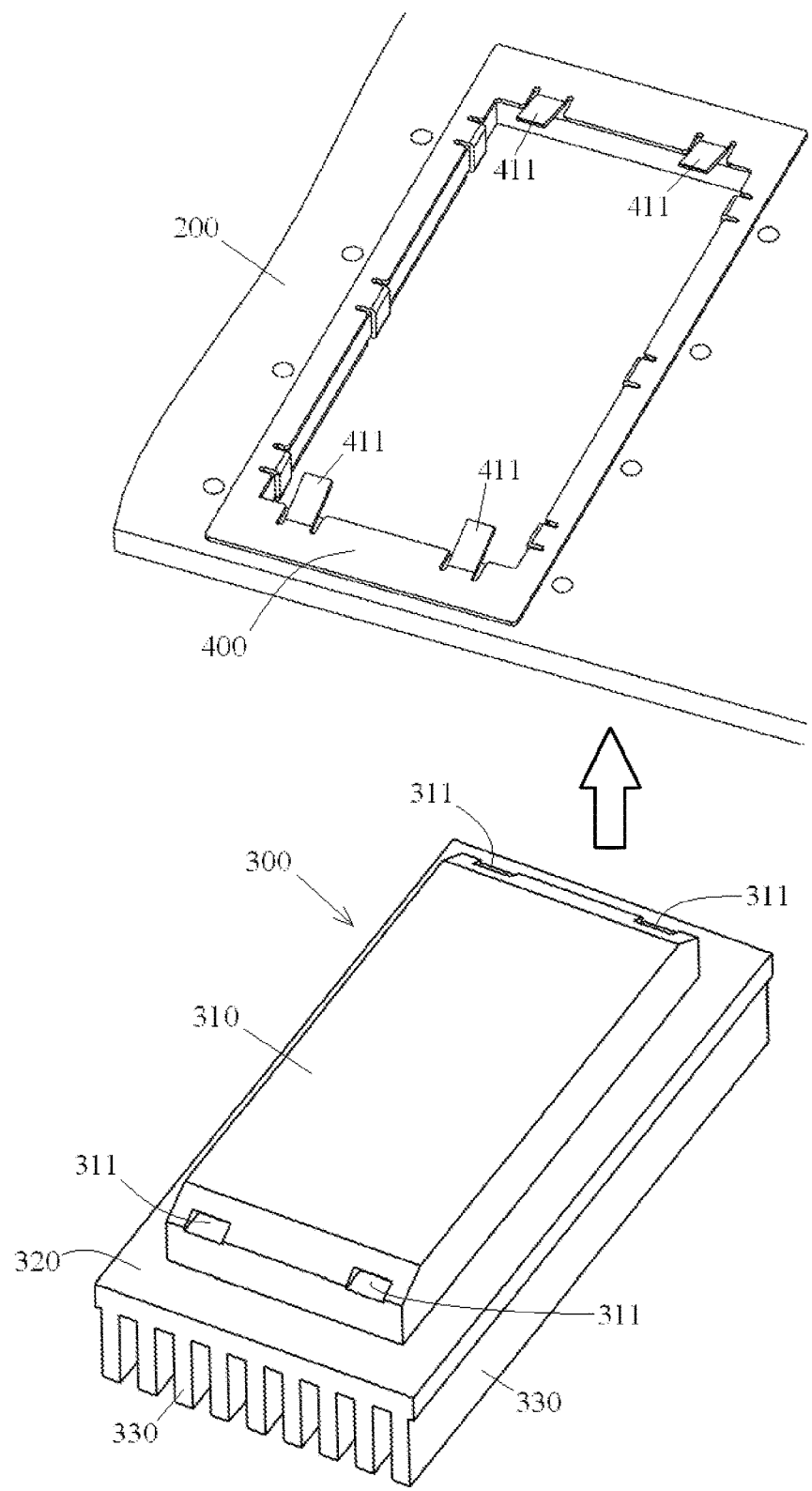
FIG. 6 is a perspective view of a connector assembly according to the invention, showing a heat exchanger being positioned on a circuit board using an elastic connector.

As shown in the embodiment of FIG. 6, the heat exchanger 300 includes a base plate 320; heat fins 330 formed on one surface of the base plate 320; and a contact boss 310 formed on the other surface of the base plate 320 opposite to the one surface.

As shown in FIGS. 1 and 6, the contact boss 310 of the heat exchanger 300 protrudes into the port 101 through the opening formed in the bottom cage, so as to contact a mating connector (not shown) inserted into the port 101. Heat fins 330 of the heat exchanger 300 protrude from the back surface of the circuit board 200 through the opening 201 (see FIG. 3) formed in the circuit board 200.

As shown in FIGS. 2-5, the elastic connector 400 includes: a frame formed by a pair of lateral end frames 410, 410 and a pair of longitudinal edge frames 420, 420 connected to each other; a first elastic piece 411 formed on an inner side of each of the lateral end frames 410, 410; and a second elastic piece 421 formed on an inner side of each of the longitudinal edge frames 420, 420.

As shown in FIGS. 2-5, one of the first elastic piece 411 and the second elastic piece 421 is adapted to be elastically snapped on an edge 221 of the opening 201 in the circuit board 200, and the other of the first elastic piece 411 or the second elastic piece 421 is adapted to be elastically snapped on the heat exchanger 300. In this way, the heat exchanger 300 may be mounted on the circuit board 200 by means of the elastic connector 400.

In an embodiment, as shown in FIGS. 2-5, the second elastic piece 421 of the elastic connector 400 is adapted to be elastically snapped on a longitudinal edge 221 of the opening 201 in the circuit board 200, so as to mount the elastic connector 400 on the opening 201 of the circuit board 200. In the shown embodiment, the elastic connector 400 is mounted on the opening 201 of the circuit board 200 simply by pressing the elastic connector 400 into the opening 201 of the circuit board 200 from the front surface of the circuit board 200.

Figure 4:
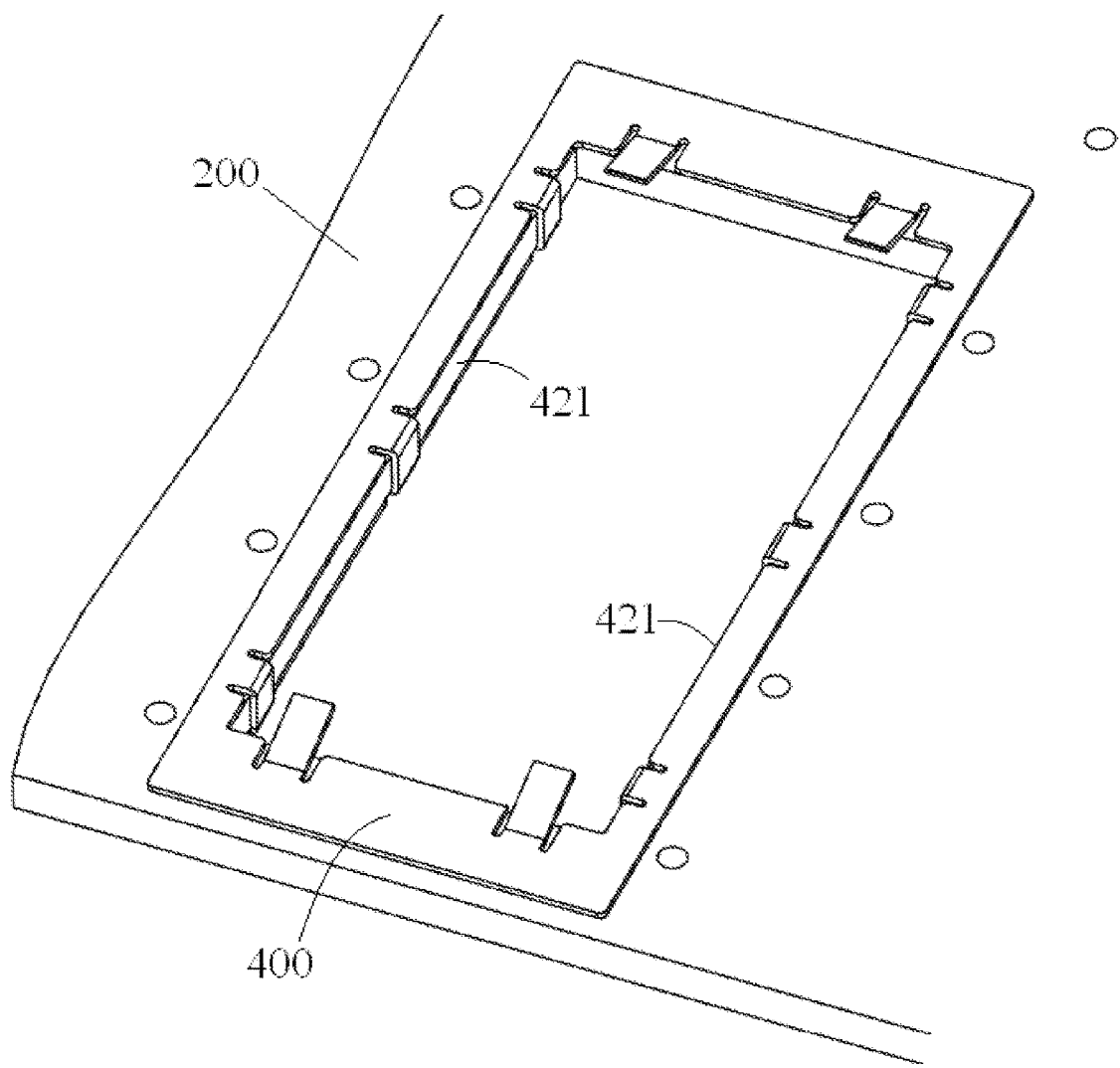
FIG. 4 is a partial top perspective view of the elastic connector of FIG. 2 positioned on the circuit board of FIG. 3.
Figure 5:
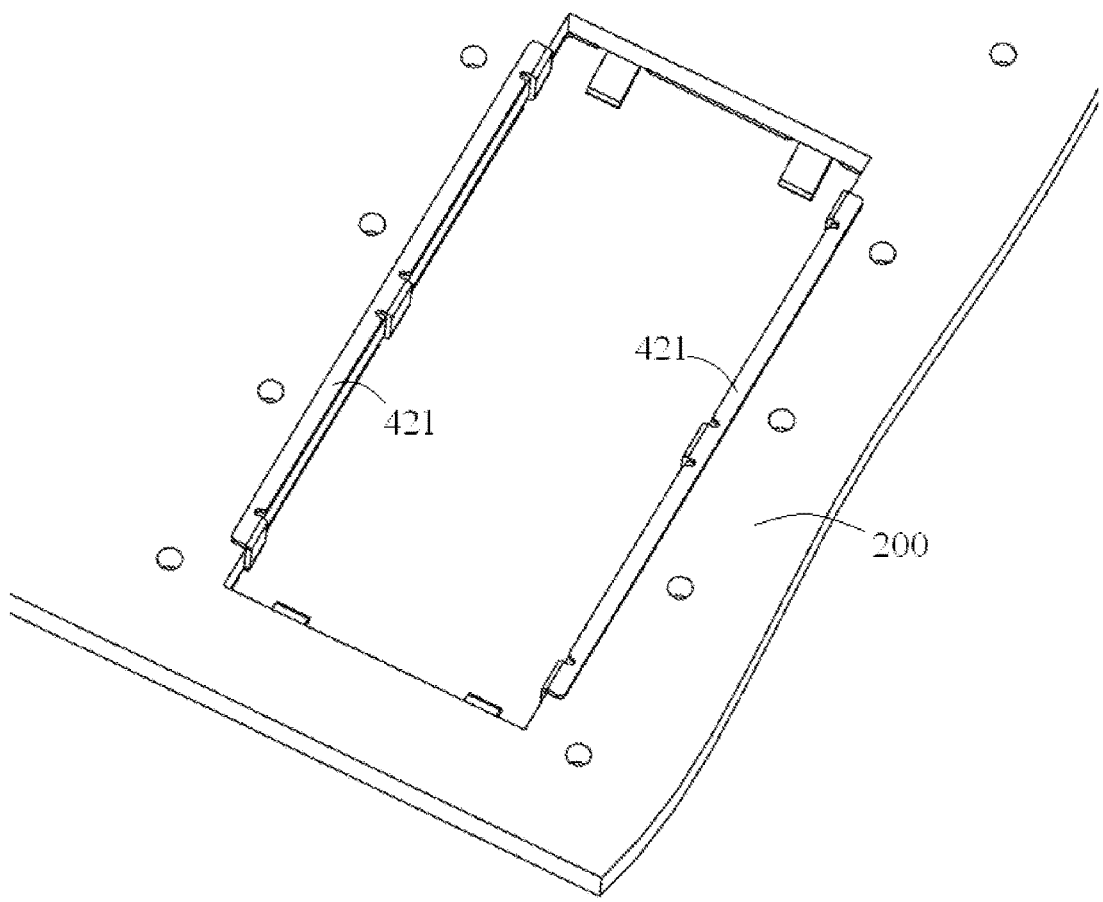
FIG. 5 is a partial bottom view of the elastic connector and the circuit board of FIG. 4.

As shown in FIGS. 4 and 5, the second elastic piece 421 extends along the longitudinal edge 221 of the opening 201 in the circuit board 200. The second elastic piece 421 has a length equal to or slightly less than that of the longitudinal edge 221 of the opening 201 in the circuit board 200.

Referring to FIGS. 2-5, a recess 311 is formed in each end portion of the contact boss 310 of the heat exchanger 300. The first elastic piece 411 of the elastic connector 400 is adapted to be elastically snapped in the recess 311 of the heat exchanger 300, so as to hold the heat exchanger 300 on the opening 201 of the circuit board 200 by means of the elastic connector 400.

As shown in FIGS. 2-5, a pair of first elastic pieces 411, separated from each other, are formed on the inner side of each lateral end frames 410 of the elastic connector 400, and a pair of recesses 311, separated from each other, are formed in each end portion of the contact boss 310 of the heat exchanger 300.

Figure 7:
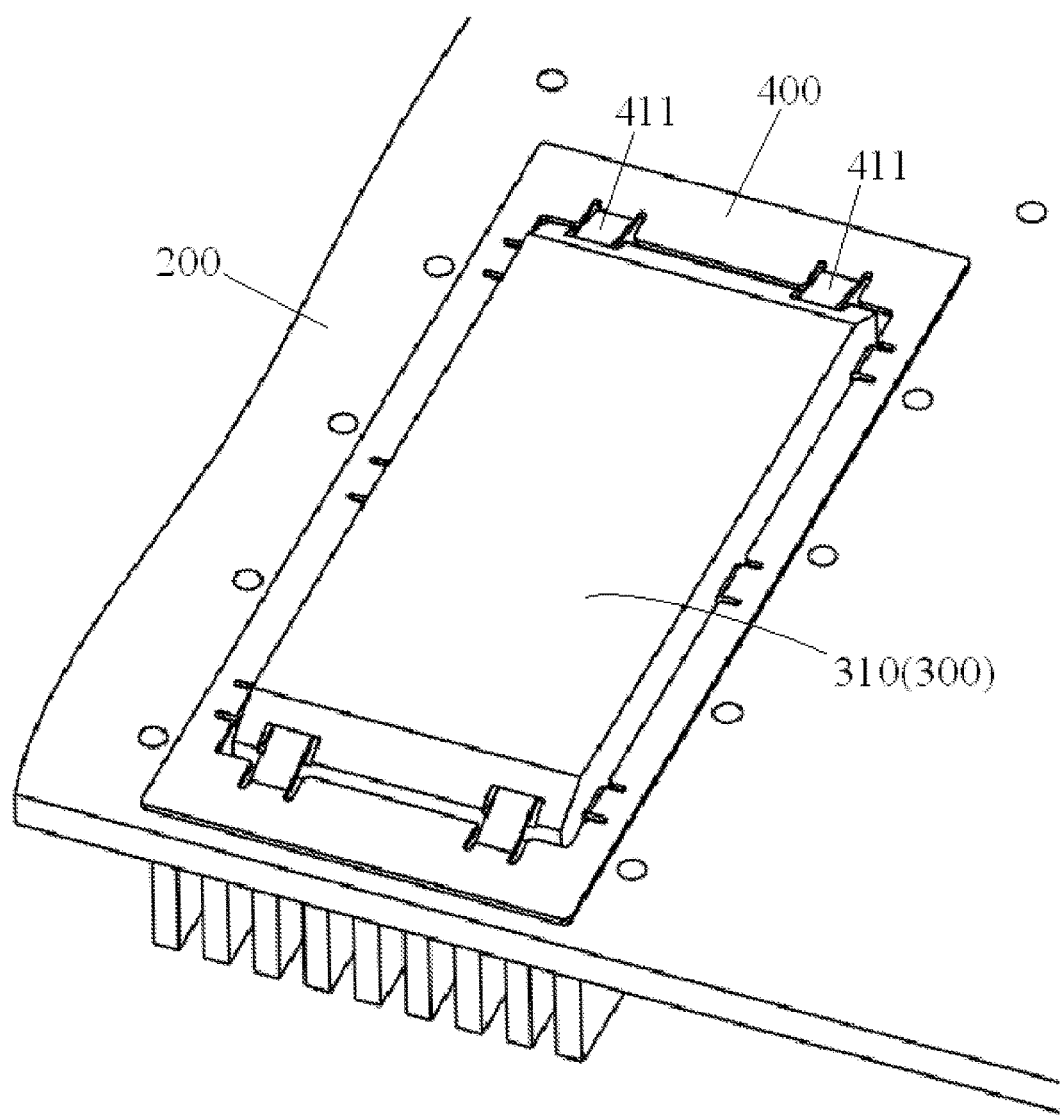
FIG. 7 is another perspective view of a connector assembly according to the invention, showing a heat exchanger mounted on a circuit board using an elastic connector.

As shown in FIGS. 6 and 7, after the elastic connector 400 is mounted on the opening 201 of the circuit board 200, the elastic connector 400 is elastically snapped on the heat exchanger 300 by pressing the contact boss 310 of the heat exchanger 300 into the elastic connector 400 from the back surface of the circuit board 200. In this way, the heat exchanger 300 and the circuit board 200 are assembled together.

Although it is not shown, in another embodiment, one heat exchanger 300 may be provided at the bottom of the cage 100 in a location corresponding to each of the plurality of ports 101.

Although it is not shown, in another embodiment, another heat exchanger may be provided on the top of the cage 100, and the another heat exchanger may be held on the outer surface of the top of the cage 100 by means of a spring clamp. In this way, since heat exchangers are provided on the top and the bottom of the cage, the heat dissipation effect of the connector may be further improved.

In an embodiment of the invention, the cage 100 may be made of metal, for example, iron or aluminum.

According to another embodiment of the invention, a connector assembly has a connector for mounting on a first surface of a circuit board 200. The connector includes a cage 100 having a bottom cage facing the first surface of the circuit board 200, and a heat exchanger 300 located on the bottom cage. One side of the heat exchanger 300 abuts against the bottom cage of the cage 100, and the other side of the heat exchanger 300 passes through an opening 201 formed in the circuit board 200 to protrude from a second surface of the circuit board 200 opposite to the first surface. An elastic connector 400 is mounted on the opening 201 of the circuit board 200, and the heat exchanger 300 is held on the circuit board 200 by the elastic connector 400.

Although it is not shown, according to another embodiment of the invention, an apparatus having housing with the above connector assembly is provided. The circuit board 200 of the connector assembly is mounted on the housing, and heat fins 330 of the heat exchanger 300 are located in a space between the second surface of the circuit board 200 and an inner wall of the housing.

It should be appreciated by those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

In the above various exemplary embodiments of the invention, the heat exchanger is provided on the bottom cage of the connector, improving the heat dissipation effect of the connector. In the present invention, an additional heat dissipation passage, independent of the top cage of the connector, is formed between the bottom cage of the connector and the apparatus housing (for example, computer housing). The cage of the connector is generally mounted on the circuit board in the apparatus housing. A space is left between the back surface of the circuit board and the inner wall of the apparatus housing, so as to prevent metal welding pots on the surface of the circuit board and pins of elements from contacting the metal housing of the apparatus. That space is large enough to receive heat fins of the heat exchanger. In this way, an additional heat dissipation passage is formed, improving the heat dissipation effect of the connector.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A connector assembly, comprising:
   a circuit board having a heat exchanger opening passing there through;
   an elastic connector positioned about the heat exchanger opening and including a pair of lateral end frames and a pair of longitudinal edge frames connected to each other, a first elastic piece disposed on an inner side of each of the pair of lateral end frames, and a second elastic piece disposed on an inner side of each of the longitudinal end frames;
   a cage defining a plurality of ports and having a bottom cage with a cage opening facing a first surface of the circuit board; and
   a heat exchanger including a base plate, heat fins disposed on a first surface of the base plate, and a contact boss disposed on a second surface of the base plate opposite to the first surface, the heat exchanger positioned on the bottom cage such that one side of the heat exchanger passes through the cage opening to protrude inside the cage, the contact boss protruding into one of the plurality of ports, and an opposite side of the heat exchanger passes through the heat exchanger opening to protrude from a second surface of the circuit board opposite to the first surface.

2. The connector according to claim 1, further comprising a recess formed in each end portion of the contact boss.

3. The connector according to claim 2, wherein the first elastic piece elastically connects with the recess to mount the heat exchanger on the heat exchanger opening.

4. The connector according to claim 3, wherein the second elastic piece extends along a longitudinal edge of the heat exchanger opening.

5. The connector according to claim 4, wherein the second elastic piece has a length equal to or slightly less than that of the longitudinal edge of the heat exchanger opening.

6. A connector, comprising:
   a cage having a bottom cage;
   a heat exchanger positioned on the bottom cage such that a first side of the heat exchanger abuts the bottom cage; and
   an elastic connector connected to the heat exchanger, the elastic connector including a pair of lateral end frames and a pair of longitudinal edge frames connected to each other, a first elastic piece disposed on an inner side of each of the pair of lateral end frames, and a second elastic piece disposed on an inner side of each of the longitudinal edge frames.

7. The connector according to claim 6, wherein the heat exchanger includes a base plate and heat fins disposed on a first surface of the base plate.

8. The connector according to claim 7, wherein the heat exchanger further includes a contact boss disposed on a second surface of the base plate opposite to the first surface.

9. The connector according to claim 8, wherein a plurality of ports are defined in the cage.

10. The connector according to claim 9, wherein the contact boss protrudes into one of the plurality of ports.

11. The connector according to claim 8, further comprising a recess formed in each end portion of the contact boss.

12. The connector according to claim 11, wherein the first elastic piece elastically connects with the recess of the contact boss.

* * * * *